(12) United States Patent
Prisecaru et al.

(10) Patent No.: US 11,079,457 B2
(45) Date of Patent: Aug. 3, 2021

(54) MICROWAVE RESONATOR FOR AN EPR PROBEHEAD PROVIDING Q-, M- AND D-VARIATION USING A VARIABLE FLUID VOLUME

(71) Applicant: Bruker BioSpin GmbH, Rheinstetten (DE)

(72) Inventors: Ion Prisecaru, Karlsruhe (DE); Peter Höfer, Ettlingen (DE)

(*) Notice: Subject to any disclaimer, the term of this patent is extended or adjusted under 35 U.S.C. 154(b) by 0 days.

(21) Appl. No.: 16/933,222

(22) Filed: Jul. 20, 2020

(65) Prior Publication Data

US 2021/0018585 A1    Jan. 21, 2021

(30) Foreign Application Priority Data

Jul. 19, 2019  (EP) ..................... 19187188

(51) Int. Cl.
*G01R 33/60* (2006.01)
*G01N 24/10* (2006.01)

(52) U.S. Cl.
CPC .............. *G01R 33/60* (2013.01); *G01N 24/10* (2013.01)

(58) Field of Classification Search
CPC .............. G01R 33/543; G01R 33/5608; G01R 33/4828; G01R 33/3415; G01R 33/283;
(Continued)

(56) References Cited

U.S. PATENT DOCUMENTS

| 3,757,204 A | 9/1973 | Hyde |
| 2014/0176136 A1* | 6/2014 | Heiss ..................... G01R 33/31 324/318 |

(Continued)

FOREIGN PATENT DOCUMENTS

| CA | 668200 A | 8/1963 | |
| JP | 11230925 A | * 8/1999 | ............. G01R 33/28 |

(Continued)

OTHER PUBLICATIONS

Poole, Charles P. Jr., "Electron Spin Resonance a Comprehensive Treatise on Experimental Techniques", John Wiley & Sons, Second Edition, 1997.

*Primary Examiner* — Jermele M Hollington
*Assistant Examiner* — Taqi R Nasir
(74) *Attorney, Agent, or Firm* — Benoit & Côté Inc.

(57) ABSTRACT

A microwave resonator for an electron paramagnetic resonance probehead comprises a cavity body supporting an electromagnetic microwave resonance mode, at least one sample opening for inserting a sample in a sample container, at least one microwave opening for transmitting microwave radiation into the resonator, and at least one access opening for inserting and removing a modifier in a modifier vessel into or out of the cavity body. The modifier vessel is fixed in the at least one access opening, the modifier is a fluid comprising attenuator fluid and/or marker fluid and/or adaptor fluid, and the modifier vessel has an insert opening for filling and discharging the modifier gradually into or out of the cavity body. This improves performance greatly, enabling a gradual modification of specific experimental conditions without moving any mechanical parts in the cavity body, and without changing other experimental conditions for Q- and/or M- and/or D-variation.

15 Claims, 7 Drawing Sheets

(58) Field of Classification Search
CPC ........ G01R 33/307; G01R 33/60; G01V 3/32;
E21B 49/08; E21B 2049/085; G01N 24/10
See application file for complete search history.

(56) References Cited

U.S. PATENT DOCUMENTS

2016/0274200 A1* 9/2016 Prisecaru ............... G01R 33/60
2018/0224414 A1* 8/2018 Kulbrandstad ........ G01R 33/60

FOREIGN PATENT DOCUMENTS

JP          11230925 A2    8/1999
JP        2000321344 A    11/2000

* cited by examiner

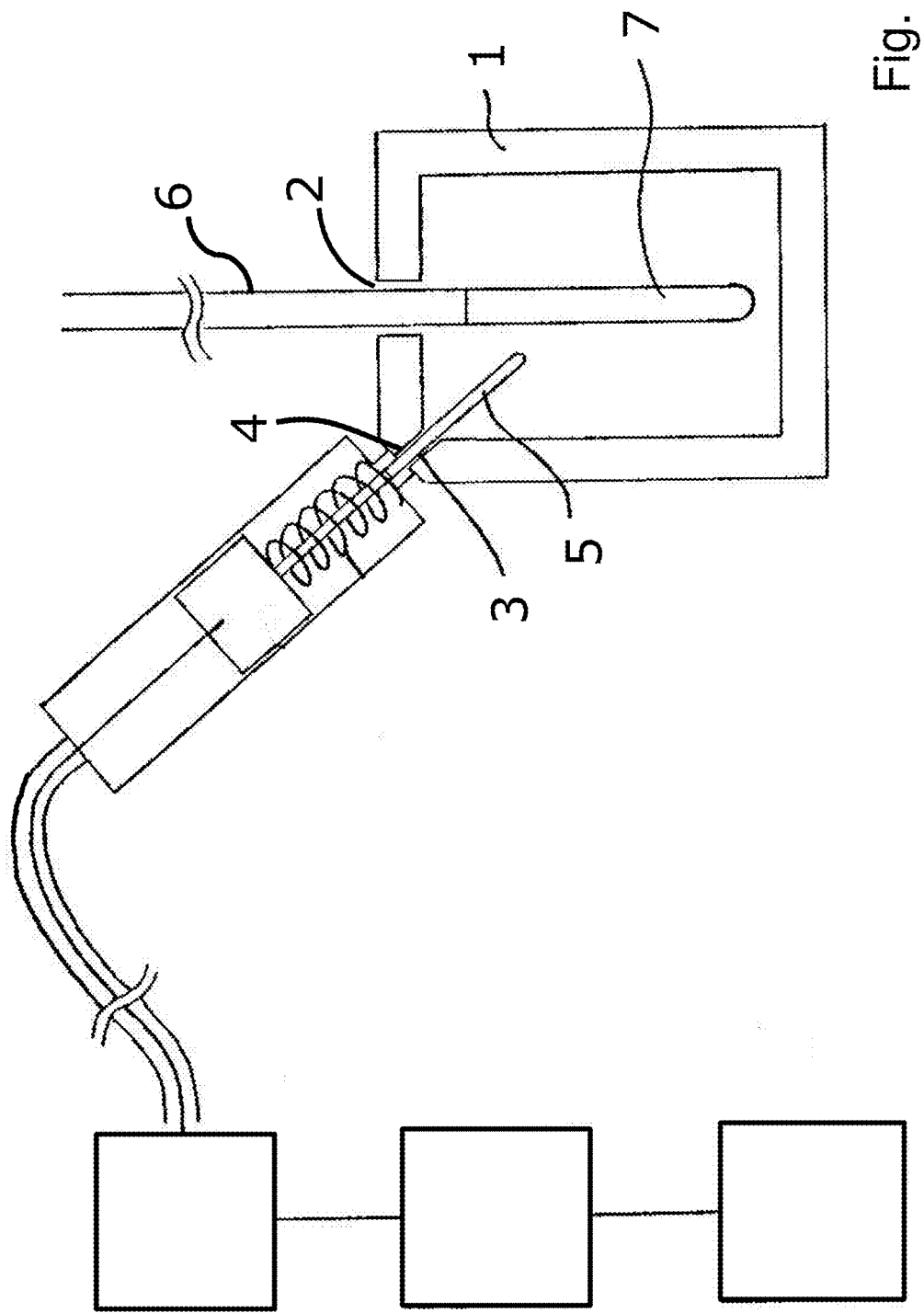

MICROWAVE RESONATOR FOR AN EPR PROBEHEAD PROVIDING Q-, M- AND D-VARIATION USING A VARIABLE FLUID VOLUME

BACKGROUND OF THE INVENTION

Field of the Invention

The present invention relates to a microwave resonator for an electron paramagnetic resonance ("EPR") probehead. A device of this type is known from JP 11230925 A2.

Description of the Related Art

EPR resonators have a certain quality factor ("Q-factor") that depends on several parameters. For certain applications, it is desirable to vary the Q-factor (i.e., a "Q-variation") quickly during one measurement.

Similarly, the EPR signal can be calibrated by using an EPR marker. For EPR samples having a strong EPR signal, a strong marker signal is required, for EPR samples having a weak EPR signal a weak marker signal is required. Gradual adaptation of the marker signal is desirable. Variation of the marker signal in the following is denoted as "M-variation".

Another aspect for optimizing the EPR measurements is a variation of the dielectric loading of the microwave resonator ("D-variation") by means of an adaptor substance. Thereby, the actual microwave mode of the resonator can be adapted, e.g., such that the magnetic B-field of the microwave mode in the measuring sample becomes more homogeneous. For small samples, a focused microwave B field is desired whereas for long sample or for pulse EPR experiments a flat microwave B-field distribution along the sample is preferred. Such D-variation is typically carried out statically by fixed installation of dielectrics in the cavity body of the microwave resonator.

Each variation described above requires the inserting or removing of a substance into or out of the microwave resonator. For clarity, these substances are defined below. Generally:

Q-variation can be performed by using an "attenuator substance" as a modifier within the cavity body of the resonator;

M-variation can be performed by using a "marker substance" as a modifier; and

D-variation can be performed by using an "adaptor substance" as a modifier.

FIG. 9 shows a configuration disclosed in Japanese Patent Application JP 11230925 A2, which describes a microwave resonator for an EPR probehead with a cavity body (1) having an opening (2) for inserting a sample (7) in a sample container (6). For varying the marker signal (M-variation), the resonator has an access opening (4) for inserting a modifier (5) in a vessel (3). The modifier vessel contains a solid marker substance. By mechanically moving (Δx) the modifier vessel in and out of the cavity, the marker signal is varied due to change of effective overlap between the microwave magnetic field of the resonator and the modifier.

The approach according to JP 11230925 A2 has the disadvantage that mechanical movement of the modifier vessel is required and that the cavity has a significant opening for inserting the modifier vessel, leading to losses of the resonant mode energy. Furthermore, the modifier vessel overlaps asymmetrically with the microwave field in the cavity leading to loss of symmetry of electric and magnetic field inside the cavity body, thereby inducing a non-uniform interaction of the EPR sample with magnetic field B1 (flux density of microwave magnetic field lines). Beyond that, the microwave field at the walls of the cavity has a low amplitude leading to a low influence of a position change of the modifier vessel, i.e. an inefficient interaction requiring a large volume of the modifier.

In a further type of prior art devices, the EPR cavity has an opening for inserting an EPR sample in a sample container. For varying the Q-factor, the resonator has an extended opening for inserting an attenuator fluid into an attenuator vessel located concentrically around the sample container and closed below it. The attenuator vessel is usually filled with water. By filling the attenuator vessel to different levels, the Q-factor is varied due to changes of overlap between the electrical field of the microwave absorbed by the water. The volume of the water in the attenuator vessel strongly depends on the size of the sample container and for X-band is typically around 70 µl. This approach is used only for Q-variation.

This approach has the disadvantage that the amount of attenuator fluid can only be increased, as no means for removing the attenuator fluid is available. Further, this setup is not suitable for low temperature EPR experiments where the sample is exposed to temperatures below 0° C., as the water attenuator would freeze, thereby changing the experimental setup. Further cavity bodies for EPR are designed such that the electrical field of the microwave close to the EPR sample has a low or vanishing amplitude. This leads to a low damping of the resonating mode by the attenuator fluid, i.e. an inefficient interaction that requires a large volume.

Furthermore, to keep the maximum of B1 in the center of the EPR cavity, the sample container must be aligned coaxially with the attenuator vessel to a high alignment precision. At the same time, the height of attenuator fluid in this coaxial arrangement always shifts the maximum of B1 axially for varying the Q-factor. Both issues make the experimental reproducibility and analysis a definite concern.

U.S. Pat. No. 3,757,204 A describes different configurations of microwave resonators employing dielectric material for improving RF field uniformity along the sample in an EPR resonator. In these configurations, two dielectric substances are inserted into the resonator. Homogeneity of the B1 field in the region of the sample is further improved by introducing dielectric rings (denoted as "22" in the patent). However, once such a ring is inserted in the resonator, there is no more D-variation possible without opening and then changing the resonator. Thus, the D-optimization according to this patent is only of a "static" nature.

For Q-, M- and D-variation, the electromagnetic energy $W_{em}$ in the volume of the modifier can be calculated from the integral shown in the following Equation (1):

$$W_{em} = \frac{1}{2} \int \left( \varepsilon E_1^2 + \frac{1}{\mu} B_1^2 \right) dV$$

where $E_1$ and $B_1$ are the electrical and magnetic field amplitudes of the microwave in the cavity, and $\varepsilon$ and $\mu$ are the complex permittivity and permeability of materials used over the volume V of the resonator.

The complex permittivity and permeability can be written as $$\varepsilon = \varepsilon' - i\varepsilon''$$

$$\mu = \mu' - i\mu''$$

The real parts of the integral in Equation 1 reflect the change of the resonance frequency of the cavity and the imaginary parts reflect either the change of the Q-factor by the electrical energy absorbed in the attenuator modifier or the magnetic spin resonance properties of the adaptor modifier.

Although defined as $E_1$ and $B_1$ above, the electric field and magnetic field of the microwave may be recited below without the index. The index "1" is used to differentiate the microwave field from further electromagnetic fields normally applied in EPR experiments, e.g., the main magnetic field which normally is denoted as $B_0$.

SUMMARY OF THE INVENTION

In accordance with the present invention, a microwave resonator for an EPR probehead comprises: a cavity body supporting an electromagnetic microwave resonance mode, at least one sample opening for inserting a sample in a sample container, at least one microwave opening for transmitting microwave radiation into the resonator, and at least one access opening for inserting and removing a modifier in a modifier vessel into or from the cavity body. The present invention describes a way to substantially overcome one or more disadvantages and trade-offs of the above-discussed existing EPR methods and devices of the prior art.

One major aspect of the present invention is to provide a high sensitivity EPR resonator, with low background signals, that, in contrast to the prior art, enables a gradual modification of specific experimental conditions without moving any mechanical parts into and out of the resonator cavity body and without changing other experimental conditions. This gradual and specific modification should be possible for Q-variation and/or for M-variation and/or for D-variation in the EPR resonator.

Another object of the present invention is to provide an EPR resonator with improved performance.

According to the present invention, these objectives are achieved by modifying the EPR resonator discussed above: 1) in that the modifier vessel is fixed in the at least one access opening; 2) in that the modifier is a fluid comprising attenuator fluid and/or marker fluid and/or adaptor fluid; and 3) in that the modifier vessel has an insert opening for filling and discharging the modifier gradually into or out of the cavity body.

The present invention describes a new device for variation of Q-factor of EPR cavities (Q-variation) by introducing an attenuator fluid as a modifier, for inserting a controlled amount of EPR active material acting as a spectroscopic marker (M-variation) and for performing a variation of the dielectric loading of the resonator (D-variation) by using an adaptor substance as a modifier. These three functionalities can be provided as independent and separate acting units (also simultaneously), or as dependent and acting together in a single unit.

The variable Q function of this device can be described as having the main advantage to be more efficient and flexible than state of the art devices. The EPR marker function of this device can be described as having the advantage of being in soluble form, which is seen as being a more flexible alternative than the state of the art in terms of choice of material and concentration.

The function of varying the dielectric loading of the resonator yields the advantage of being able to modify the microwave magnetic field in the sample region according to the sample size and according to the EPR experiment performed, and can also be performed continuously.

In preferred embodiments of the present invention, the cavity body has two access openings for accommodating an inlet and an outlet of the modifier vessel. These two openings allow easier insertion and retraction of the modifier fluid into and out of the cavity body.

These embodiments can be further refined in that the two access openings are located symmetrically with respect to a microwave B-field symmetry plane in the cavity body, and in particular at symmetric positions in the wall of the cavity body. By symmetrically locating the two openings with respect to the microwave B-field symmetry plane, the change of symmetry of the resonant mode of the resonator interacting with the modifier fluid is minimized.

In a further embodiment of the invention, a part of the modifier vessel extending inside the cavity body is spatially fixed to a support. Thereby, it is possible to use a modifier vessel having a flexible and/or conformal structure. This embodiment can be further improved when the support follows a special path that maintains the resonance mode symmetry.

In another embodiment of the invention, the cavity body is a cylindrical TE011 mode cavity and the modifier vessel inside the cavity body is arranged to a minimum extent of 50% of its length, preferably more than 80%, along a cylindrical surface centered around the axis of the cylindrical TE011 mode cavity. In such a TE011 mode cavity, the electromagnetic field has a cylindrical symmetry. The change of symmetry of the microwave mode of the resonator interacting with the modifier fluid is minimized by this means.

In alternative embodiments of the invention, the cavity body is a rectangular TE102 mode cavity or a cylindrical TM110 mode cavity, and the modifier vessel traverses the walls of the cavity body and runs partially outside the cavity body. Use of the specified modes allows a simple design of the resonator and the dielectric elements. Compared to a TE011 mode cavity in the above cases, the isolines are not closed loops. To achieve maximum efficiency in the rectangular TE102 mode, and for cylindrical TM110 mode cavities, it is preferred to run the modifier fluid partially outside the cavity body, thereby skipping areas in the cavity body where the microwave electromagnetic field has a low interaction with the modifier fluid.

In a further embodiment of the invention, the EPR resonator is characterized in that the modifier vessel inside the cavity body is arranged to a minimum extent of 50% of its length, preferably more than 80%, along isolines of constant electric field E for Q-variation and D-variation or along isolines of constant magnetic field B for M-variation. An arrangement of the modifier vessel along isolines yields the advantage that the magnitude of interaction of the M- and D-modifier fluid with the microwave in the metal cavity body is largely linear throughout its length, while for Q-modifier fluids it contains regions of almost linear dependency, i.e. the more fluid is inserted in the modifier vessel the higher the interaction with the microwave field.

A further class of embodiments of the invention is characterized in that the modifier vessel is connected to a modifier reservoir outside the cavity body via a first pump allowing for filling and discharging the modifier fluid into or out of the cavity body. This setup allows for Q-, M- and D-variation of the resonator with the highest flexibility. The modifier vessel can be filled completely with modifier fluid or emptied therefrom.

This class of embodiments can be further improved when the modifier vessel is branched to the modifier reservoir via a first valve, and to a neutral fluid reservoir via a second valve and a second pump, thereby allowing to gradually or alternatively replace the modifier liquid in the cavity body with the neutral fluid, whereas the neutral fluid has no dominant effect on Q-variation and/or M-variation and/or D-variation. By means of the branch modifier, fluid can be completely or alternatingly replaced with a neutral fluid (a gas or a liquid) that has almost no interaction with the microwave field.

In a first of three alternative classes of embodiments, the EPR resonator according to the present invention comprises at least two modifier vessels, each modifier vessel containing a different type of modifier fluid. Performing, e.g., Q- and M-variation simultaneously or in sequence using two separate modifier vessels with a fluid absorber and a fluid marker in this case (or even more than two different modifier vessels) will yield maximum flexibility for the EPR resonator.

The embodiments of this class can be even further improved, when each modifier vessel is connected to a separate modifier reservoir via a pump, allowing for independent filling and discharging of each modifier fluid into or out of the cavity body.

In a second class of alternative embodiments, the EPR resonator is characterized in that the modifier fluid contains at least two different types of modifier materials, in particular attenuator fluid for Q-variation and/or marker fluid for M-variation and/or adaptor fluid for D-variation.

In a third class of alternative embodiments, the EPR resonator is characterized in that the modifier vessel in the cavity body is arranged to a minimum extent of 50% of its length, preferably more than 80%, at the maximum of the electric field energy for Q-variation, at the minimum of the z-component of the magnetic field strength of the microwave mode for D-variation, in a region where the z-component of the magnetic field strength of the microwave mode is not zero for M-variation, whereas the z-axis is defined by the center of the sample opening and the center of the cavity. This is just most effective.

The scope of the present invention covers also an EPR probehead with a microwave resonator and an EPR spectrometer with a probehead comprising a microwave resonator as described above, as well as a housing for holding the resonator located in a static magnetic field along an axis perpendicular to the z-axis.

An especially preferred class of embodiments of the invention is characterized in that the modifier vessel comprises or is made of a dielectric capillary. Using a capillary yields the advantage of precisely locating the modifier fluid in the resonator, and as a capillary has a low transverse extension, a uniform interaction with the microwave field in the resonator. The use of a capillary further yields the fundamental advantage that the influence of the asymmetry of the modifier fluid in the cavity body onto the symmetry of the microwave mode is minimized.

The capillary can be made of flexible, chemically inert, EPR-signals free material having a low loss at microwave frequencies, in particular Teflon® or PFA, and has preferably an inner diameter of below 1.5 mm, more preferably of about 100 μm, especially for X- and Q-band resonators. Moreover, the length of the capillary in the cavity body may be about 50 mm and the number of winding turns for a TE011 mode cavity can be up to 10. The cavity body of an EPR resonator according to the present invention will always be made of electrically conductive material, normally of metal. In certain applications, the EPR resonator according to the present invention may be a microwave resonant structure.

In most practical applications, the modifier fluid will be a liquid. For high field EPR applications or for low temperature applications, the modifier fluid could be a gas (ionized, paramagnetic, neutral or noble) or gas-gas mixture or an airborne gas-particle mixture of suitable concentrations. An example of a modifier fluid for Q-variation may be water having $\epsilon' \approx 80$ at X-band frequencies around 10.5 GHz and almost all other polar liquids. An example of a modifier fluid for D-variation may be Carbon tetrachloride having $\epsilon' \approx 2.2$ or Bromobenzene having $\epsilon' \approx 4.4$ at X-band frequencies around 10.5 GHz. An example of a neutral fluid may be Benzene having $\epsilon' \approx 2.2$ at X-band frequencies around 10.5 GHz and other non-polar liquids. An example of a modifier fluid for M-variation may be a nano-powder EPR marker like chromium oxide encapsulated by a molecule that allows suspension of the marker in a liquid like Benzene.

The attenuator fluid can be mixed with a soluble marker substance for calibration of the EPR-spectrometer, and/or with an adaptor fluid for performing a variation of the dielectric loading of the resonator, so as to enable combined Q-variation, M-variation and D-variation.

Also covered by the scope of the present invention are methods for measuring EPR spectra. In a preferred variant of these methods, the inserted length of the modifier fluid inside the cavity body is changed during the measurement. This variant can be further refined according to a first alternative comprising the following steps:

performing a calibration measurement for defining the Q-factor variation, starting with a low volume of attenuator fluid, preferably about 0 mm length in the cavity body, for obtaining a high-sensitivity measuring mode, preferably with the highest Q-factor, of the cavity for the experiment;

recording of the EPR spectrum and focusing on the absorption lines with the lowest linewidth;

decreasing the Q-factor incrementally, thereby increasing the spectroscopic resolution, and recording an EPR spectrum of the absorption lines in focus;

observing the linewidth decrease;

stop decreasing the Q-factor when the linewidth does not decrease anymore with change in Q, thereby determining the optimum Q-factor for each line;

performing at least one measurement of the complete spectrum by adapting the Q-factor when scanning over the absorption lines.

In a second alternative of this method variant, the following steps are comprised:

determining before a measurement the approximate positions and linewidth of the known EPR absorption lines;

setting the Q-factor directly to a desired value for each absorption line, thereby applying a previously recorded proportionality between Q-factor and changes in attenuator volume in the cavity body (compare FIG. 8);

slowly inserting the attenuator fluid, thereby increasing its length $\Delta x$ until the attenuator fluid length $\Delta x$ corresponds to the desired Q-factor;

if further Q-variation is required, actuating a first pump in direct or reverse direction using smaller steps.

A further variant of the above-described method is characterized by parking or rebooting the Q-variation system by switching from a first valve to a second valve and using a second pump as an air pump, thereby purging out the modifier fluid and bringing the system back in high-Q and/or highest sensitivity performance.

Another variant comprising a refined method for mixed use Q-variation is characterized by employing a plurality of first valves and feeding them to various suitable fluids materials, in particular acetone, alcohol, inorganic oils, using them either sequentially or in different time intervals sections with and without attenuator fluid in the attenuator vessel to provide cleaning, purging or a combination of extended EPR experimental setups.

A further variant of the above-described method is characterized by inserting more or less marker fluid into the marker vessel depending on the EPR sample signal strength of the EPR sample in the cavity body of the resonator. For low EPR sample signal strength, a low volume of marker fluid is inserted, for high EPR sample signal strength, a higher volume of marker fluid is inserted into the cavity body.

This variant can be further improved when a calibration measurement is performed by increasing the volume of the marker fluid slowly until its signal strength is sufficient to be registered in parallel to the EPR sample signal.

Further advantages of the invention can be found in the description and the drawings. Likewise, the features mentioned above and set out in the following, according to the invention, can each be used individually per se or together in any combinations. The embodiments shown and described are not to be understood as an exhaustive list, but instead are of an exemplary nature for describing the invention.

BRIEF DESCRIPTION OF THE DRAWINGS

In order to make the previously mentioned and other features and advantages of the present invention more apparent to those skilled in the art, preferred embodiments of the present invention will be described in detail below by referring to the accompanying drawings, wherein identical numerals represent the same parts.

In the drawings:

FIG. 9 is a selection of a relevant diagram from the prior art.

DETAILED DESCRIPTION

While only certain features of the invention have been illustrated and described herein, many modifications and changes will occur to those skilled in the art. It is, therefore, to be understood that the appended claims are intended to cover all such modifications and changes as fall within the true spirit of the invention.

In this description, the term "isoline" is used several times. In a similar context in literature, the term "equipotential lines" or "isolines for electric potential" is used. Here we define an isoline of the electromagnetic field as a line of constant electromagnetic field strength, especially the field strength E, B of the microwave. Depending on the cavity mode, this line may be a closed loop. Some cavities do not generate closed loop isolines of electromagnetic field at all.

Figure 1:
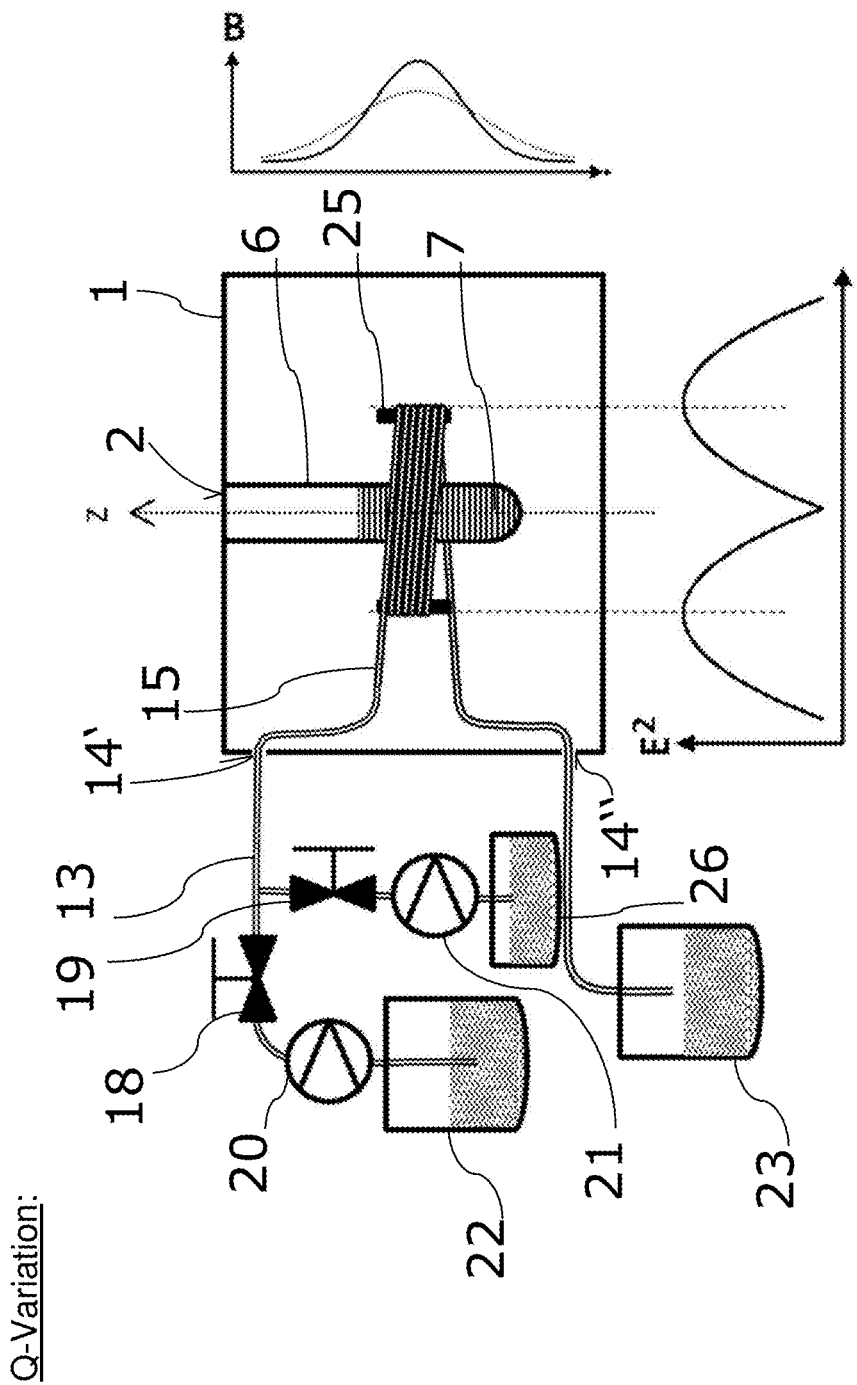
FIG. 1 shows a schematic sketch of an embodiment of the invention for Q-variation.

FIG. 1 shows a first embodiment of the invention. A cavity body 1 of a microwave resonator supporting an electromagnetic microwave resonance mode has a sample opening 2 for inserting a sample 7 in a sample container 6. For simplicity, the microwave opening for transmitting microwave radiation into the resonator is not displayed here.

The cavity has two access openings 14' and 14" for accommodating an inlet and an outlet of a capillary 13. The two openings are located at symmetric positions in the wall of the cavity body. Due to the structure of the microwave field in the cavity body, the openings are located symmetrically with respect to a microwave B-field symmetry plane, too.

Attenuator fluid 15 is inserted into the cavity body 1 via the capillary 13 from a modifier reservoir 22 with the help of a first pump 20. Attenuator fluid 15 may be gradually inserted into, or removed from, the cavity body 1 by stepwise activation of the first pump 20 and/or reversal of its pumping direction.

For discharging the attenuator fluid 15 from the cavity body 1, the capillary is branched to the modifier reservoir 22 via a first valve 18 and to a neutral fluid reservoir 26 via a second valve 19 and a second pump 21. Thereby, attenuator fluid 15 can be gradually or alternatively replaced with the neutral fluid in the cavity body 1 by opening and closing the first and second valves alternately, and activating or deactivating the first and second pumps correspondingly. For the purpose of Q-variation, the neutral fluid must have no dominant effect on the attenuation of microwave energy in the cavity body 1, i.e. its microwave absorption must be significantly smaller than that of the attenuator fluid. The neutral fluid may be a gas (air, $N_2$, etc.) or a liquid like benzene, the latter having the benefit of more functions like, e.g., cleaning the capillary. For discharging, the attenuator fluid is moved into waste fluid container 23 via the second access opening 14".

The embodiment in FIG. 1 shows a side view of a cylindrical cavity suitable to resonate in a TE011 mode with the z-axis being the cylindrical axis, i.e. the axis comprising the center of the sample opening 2 and the center of the cavity body 1. To the right of the cavity body, the projection of the profile of the microwave magnetic field B on the z-axis is shown. The solid line shows the magnetic field with attenuator fluid filled into the capillary in the cavity body; the dotted line indicates the same without attenuator fluid in the capillary in the cavity body. It can be seen that inserting attenuator fluid into the cavity does not disturb the symmetry of the microwave magnetic field in the center of the cavity.

In FIG. 1, below the cavity body, the profile of the electric field energy being almost proportional to $E^2$ is shown. For Q-variation, the capillary is arranged to a minimum extent of 50% of its length in the cavity body, preferably more than 80%, at the maximum of the electric field energy of the microwave mode. The specific placement of the capillary in the maximum of the electric field energy yields an improved efficiency of the setup compared to the prior art, e.g., a factor of 10 less attenuator fluid is required to achieve a factor of 3 higher variation of the Q-factor.

To stabilize the setup, a part of the capillary extending inside the cavity body 1 is spatially fixed to a support 25, which itself is fixed to the cavity body (not shown here). Thereby, a capillary made of a flexible material like Teflon™ can be used. The capillary is arranged to a minimum extent of 50% of its length, preferably more than 80%, along a cylindrical surface centered around the axis of the cylindrical TE011 mode cavity. The cylindrical surface reflects the cylindrical symmetry of the TE011 mode. Thereby the capillary can be arranged along the isolines of constant electric field E. Interaction of the attenuator fluid with the microwave mode on isolines yields the advantage that changing the fluid column in the capillary does not disturb the symmetry of the microwave mode. The same applies to the setups for M-variation and D-variation described below.

Figure 2:
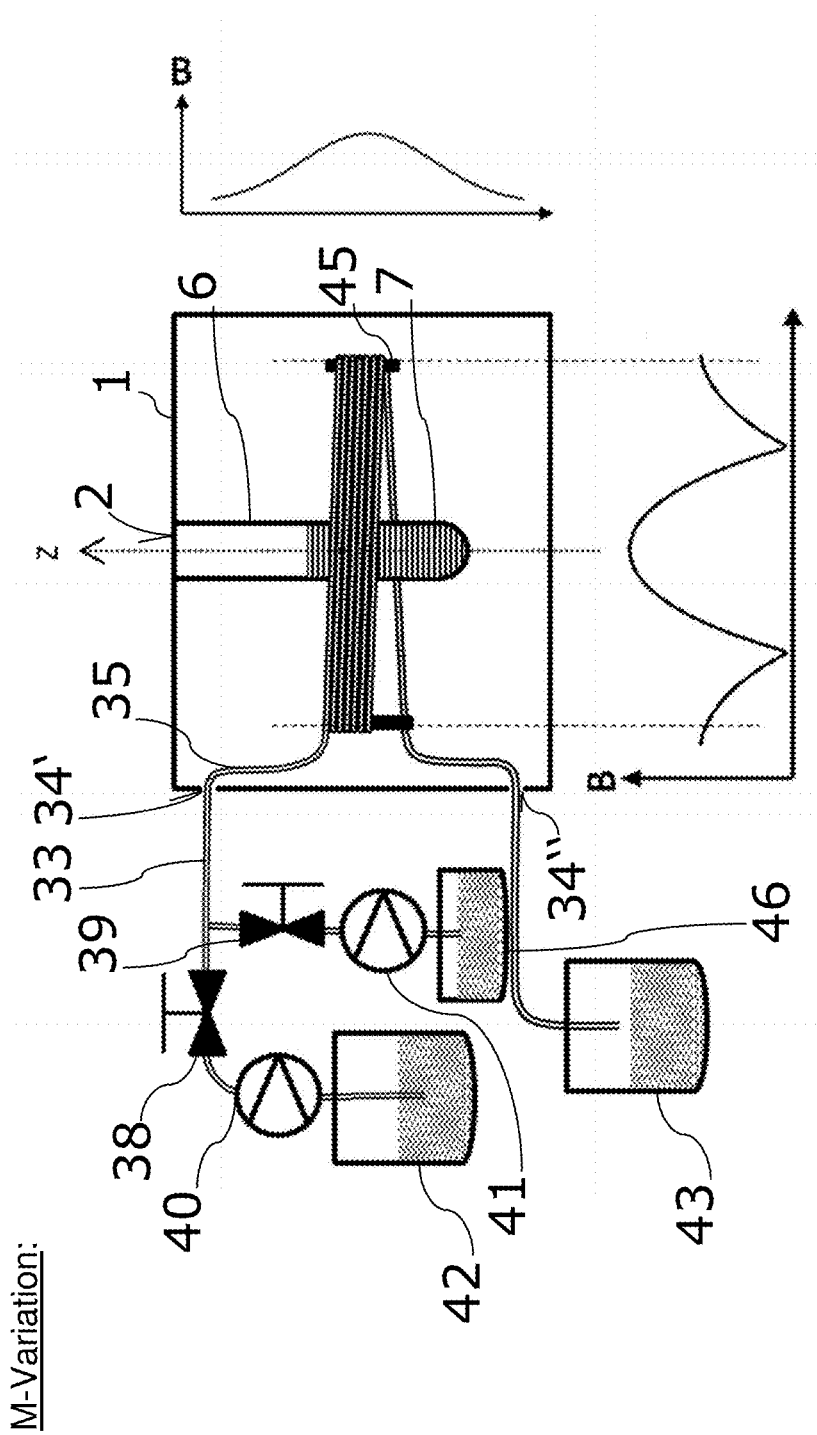
FIG. 2 shows an embodiment for M-variation.

FIG. 2 shows a similar setup to FIG. 1. Different than for Q-variation, for M-variation capillary 33 is not located in the maximum of the electrical field energy, but in a region where the z-component of the magnetic field strength of the microwave mode is not zero. The strength of the magnetic field at the position of the capillary is shown in the diagram below the cavity body 1. As shown on the right side of the cavity body 1, the B field on the z-axis remains almost unchanged even when marker fluid 35 is inserted into the cavity body. As the marker fluid signal must become visible in the measured EPR signal, it is desirable that the capillary be arranged to a minimum extent of 50% of its length, preferably more than 80%, in a region where the z-component of the magnetic field strength of the microwave mode is not zero. To optimize the setup, it is preferred to locate the capillary at the largest possible z-component of the magnetic field strength. However, normally physical restraints do not allow locating the capillary very close to the wall of the cavity body.

FIG. 2 discloses marker fluid 35 inserted into, or discharged from, the cavity body. Components with identical reference numbers or names in FIGS. 1 through 6 refer to equivalent functionality. However, in FIG. 2, components having functions corresponding to those of the FIG. 1 embodiment are nevertheless given different reference numbers. These include modifier vessel 33, access openings 34' and 34", first valve 38, second valve 39, first pump 40, second pump 41, modifier reservoir 42, waste fluid container 43 support 45 and neutral fluid reservoir 46. In order to keep this document short, any repeating of common characteristics is avoided, but those skilled in the art will understand that the operation of these components is essentially the same as for the corresponding components of FIG. 1.

Figure 3:
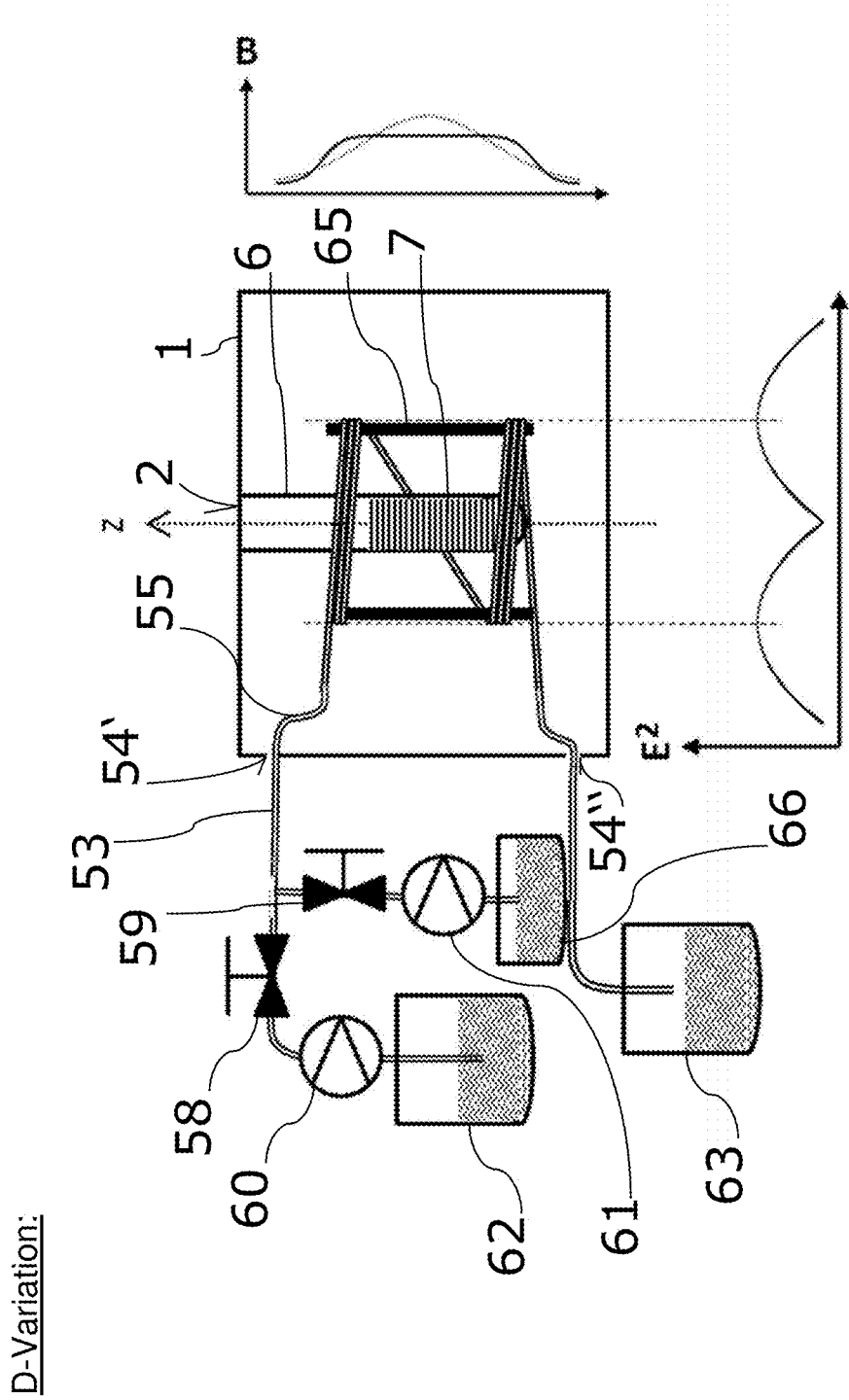
FIG. 3 shows an embodiment for D-variation.

FIG. 3 shows a third setup similar to the setup for Q-variation of FIG. 1. Whereas a major part of the capillary is at a similar radial location, its z-coordinate is different. For D-variation, the capillary 53 is gradually filled with an adaptor fluid 55. Although electric field energy of the microwave mode is required to achieve a variation of the dielectric loading of the resonator, at the same time the interaction with the magnetic field strength of the microwave mode should be minimized. This is achieved by arranging the capillary in the cavity body 1 to a minimum extent of 50% of its length, preferably more than 80%, at the minimum of the z-component of the magnetic field strength of the microwave mode. Preferably, the whole capillary in the cavity body is positioned equally and symmetrical to the magnetic field mirror plane (i.e. the transversal middle plane of cylinder for TE011 mode).

As shown on the right side of the cavity body 1, the B field is modified via the adaptor fluid. Filling the capillary with adaptor fluid leads to an extension of homogeneous length on the z-axis. Thereby bigger samples can be investigated with a higher spectral resolution as the magnetic field in almost all parts of the sample has a higher homogeneity. If smaller samples are to be investigated, the adaptor fluid can be gradually removed from the cavity body. When no adaptor fluid is in the cavity body, the magnetic field on the z-axis is as shown with a dotted line. The support 65 holding the capillary in the cavity body 1 may itself be a dielectric shaped to form the electromagnetic microwave mode too.

FIG. 3 discloses adaptor fluid 55 inserted into or discharged from the cavity body. In FIG. 3, components having an analogous operation to corresponding components of the FIG. 1 embodiment are nevertheless given different reference numbers. These include modifier vessel 53, access openings 54' and 54", first valve 58, second valve 59, first pump 60, second pump 61, modifier reservoir 62, waste fluid container 63 support 65 and neutral fluid reservoir 66.

For simplicity, field lines and field strengths of the microwave mode are not shown inside the cavity body in FIGS. 1-3. The expert is referred to standard literature of microwave resonators to get an impression of these mode structures.

Figure 4:
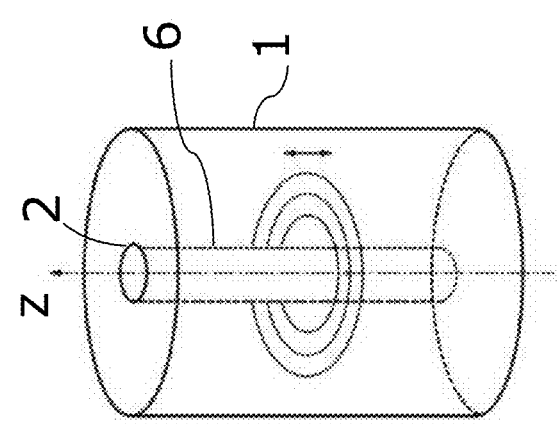
FIG. 4 illustrates isolines of the microwave field for a cylindrical TE011 cavity.

FIG. 4 shows the B or E isolines of the electromagnetic field strength in a cylindrical TE011 mode cavity. As can be seen, these isolines adapt to the symmetry of the cavity body. As a general matter, the strength of the electromagnetic field varies with the distance to the z-axis.

Figure 5:
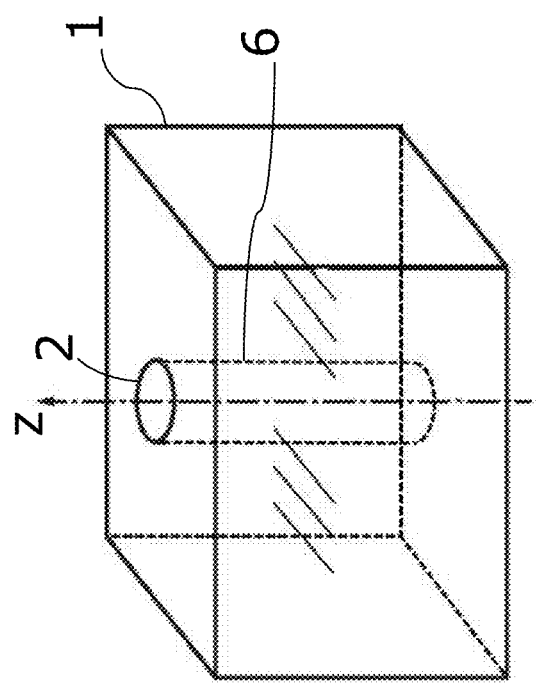
FIG. 5 illustrates isolines of the microwave field for a rectangular TE102 cavity.

FIG. 5 shows the B and E isolines of the electromagnetic field strength in a rectangular TE102 mode cavity. Due to mode symmetry, in this case the isolines of equal field strength exist as pairs on both sides of the z-axis. It should be noted that field strength in the context of this document shall mean the magnitude of the corresponding field, i.e. without a sign before the value.

Figure 6:
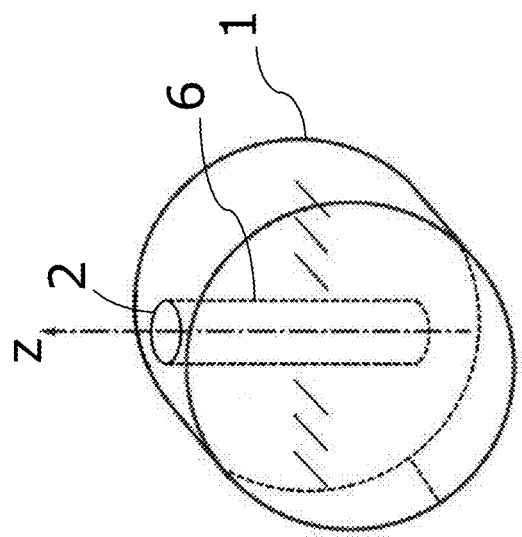
FIG. 6 illustrates isolines of the microwave field for a cylindrical TM110 cavity.

FIG. 6 shows isolines of the electromagnetic field in a cylindrical TM110 mode cavity. Due to mode symmetry, the isolines of equal field strength exist as pairs on both sides of the z-axis.

In a preferred embodiment, the modifier vessel for rectangular TE102 mode cavity or cylindrical TM110 mode cavity runs partially outside the cavity body. This is preferred as isolines different to the TE011 mode cavity are no closed loops. To minimize unwanted interaction with the microwave field, a part of the modifier vessel is therefore guided outside the cavity body. Preferably, isolines on both sides of the z-axis are connected outside the cavity body.

Figure 7:
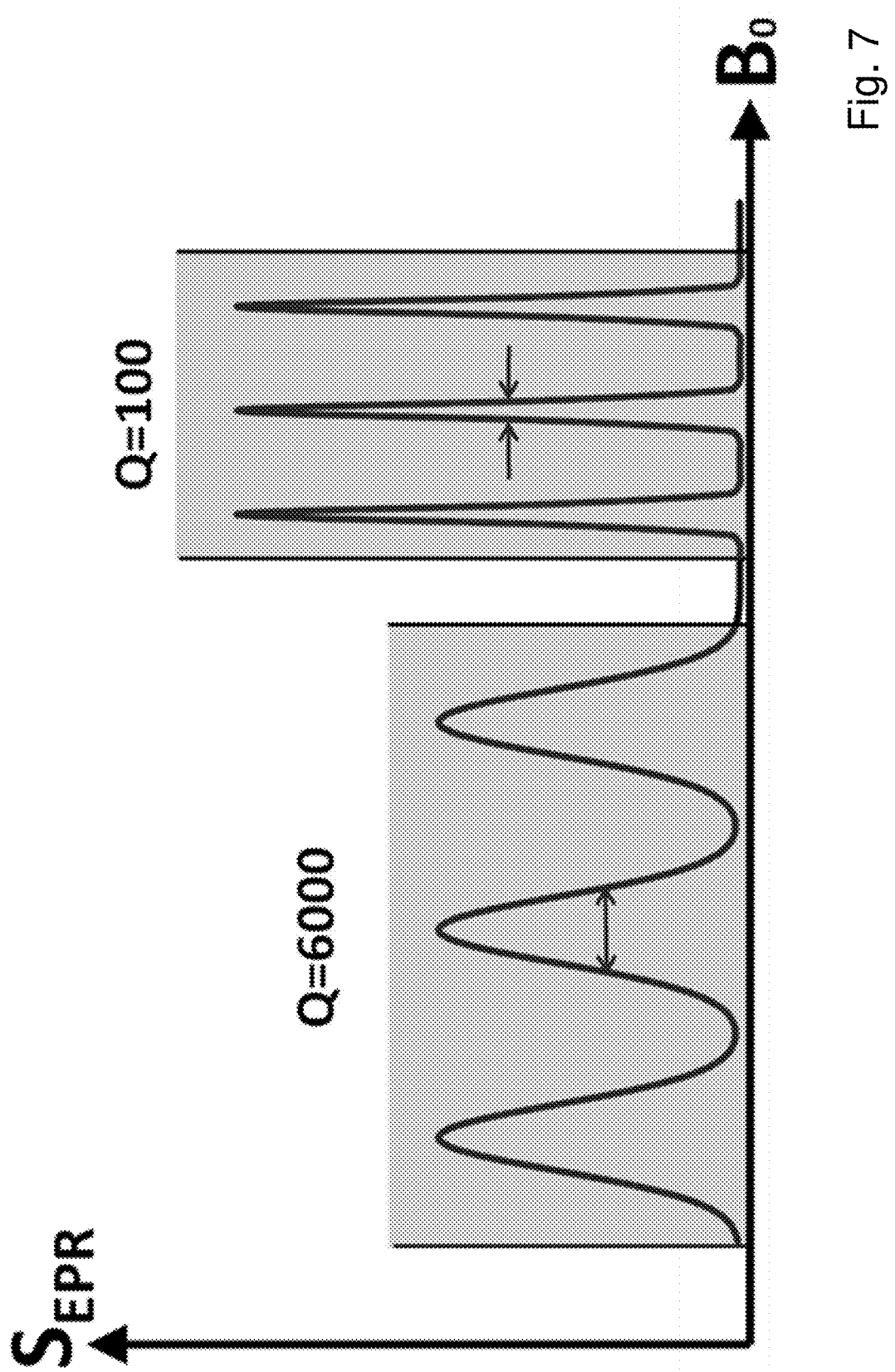
FIG. 7 illustrates the variation of Q-factor during an EPR experiment.

FIG. 7 shows an example of an EPR signal SEPR measurement requiring Q-variation. The spectrum comprises two regions with absorption lines having different linewidths. To measure the EPR signal SEPR, the main magnetic field $B_0$ is increased. In the region of the narrow absorption lines, the Q-factor is modified to be 100, whereas in the region of the broad absorption lines the Q-factor is increased to 6000. This Q-factor change is needed both to adapt the resonator bandwidth to the minimum value required to measure the signal linewidth undistorted (sharper signal absorption lines require lower Q-factor), and to maximize the sensitivity of measurement (higher sensitivity requires a higher Q-factor). The needed adaptive Q-variation can be achieved during one experiment by using the invention as described herein.

Figure 8:
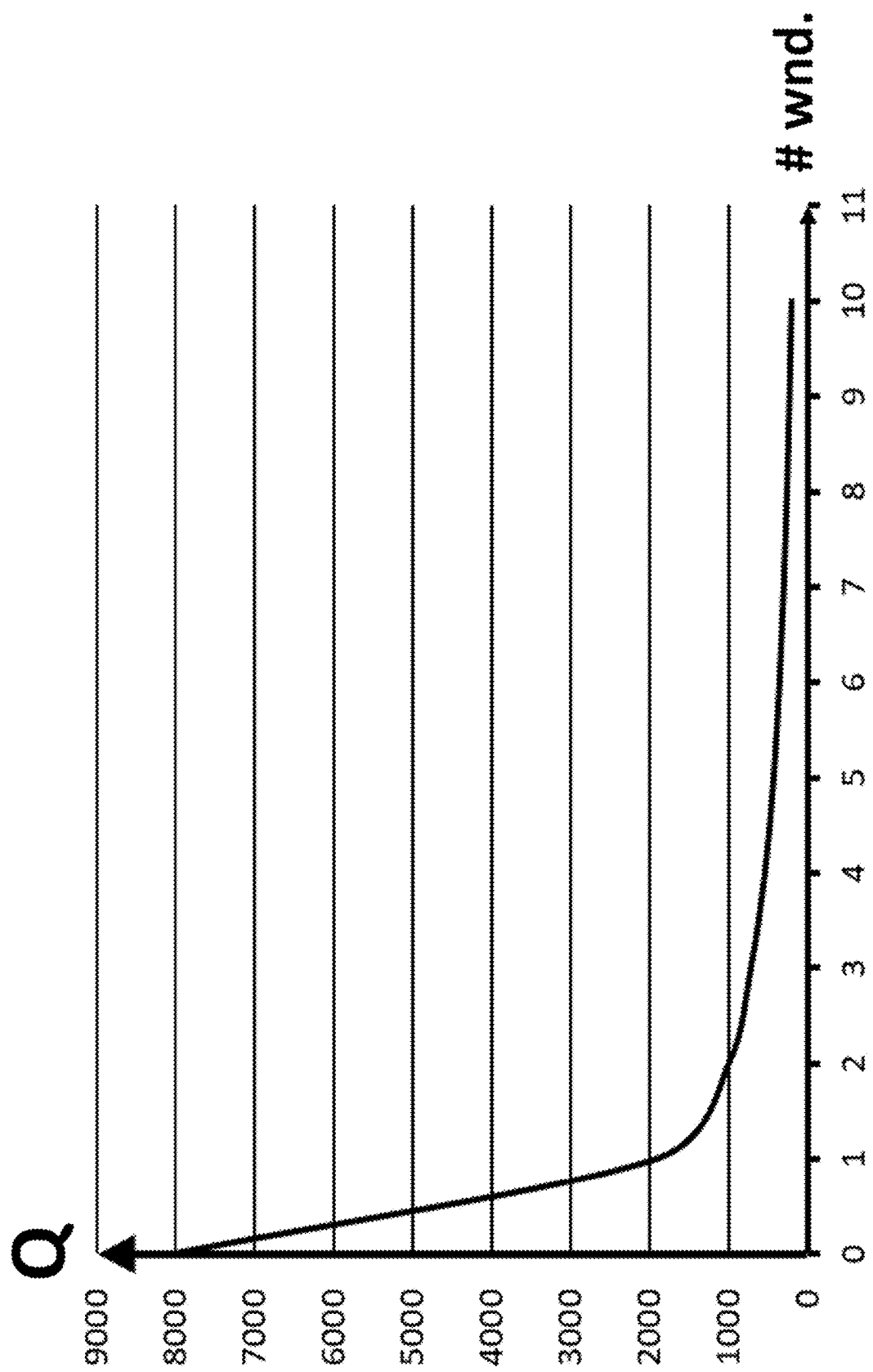
FIG. 8 illustrates the dependence of Q-factor on windings filled with attenuator fluid.

FIG. 8 shows the variation of the Q-factor over the number of windings of the capillary, e.g. as in FIG. 1, progressively filled with absorber fluid. As can be seen, the Q-factor decreases almost linearly until the first winding of the capillary in the cavity body is filled with attenuator fluid. Further reduction is achieved by filling more windings with attenuator fluid. The figure moreover shows the expected improvement of efficiency using a modifier vessel in an optimal position in the resonator. The obtained variation in Q-factor here ranges from 8000 to 200.

The setup shown in FIG. 1 allows a gradual variation of the Q-factor of the cavity body without any movement of mechanical parts into and out of the cavity. The basic function of Q-variation may be achieved with the help of the modifier reservoir 22 and the first pump 20, alone. Activating the pump in one pumping direction allows inserting attenuator fluid into the cavity body. During EPR measurement the first pump 20 can be stopped. Further variation can be achieved by gradual insertion of more attenuator fluid. Removal of all attenuator fluid can be achieved by reversing the pumping direction of the first pump 20.

Furthermore, it is obvious that a capillary is a preferred embodiment. Other shapes and forms of the modifier vessel are possible. That vessel would require having at least one opening which would serve for inserting and removing the modifier fluid into and out of the modifier vessel located inside the cavity body. This could be achieved, e.g., by compressing a neutral gas in the modifier vessel when inserting the modifier fluid. Alternatively, the insert opening could have a bigger diameter for inserting modifier liquid at the lower side of the insert opening and at the same time removing neutral gas in the upper part of the opening.

The mechanically static nature of the support 25, 45, 65 makes the device especially suitable for use in resonators difficult to build, like those for Rapid Scan EPR. The advantage of mechanical simplicity makes the device suitable also for manual operation using syringes instead of electrical pumps. Furthermore, the mechanical placement for the capillaries described in this document is in fact optimal on more accounts, as it is outside of the holes or regions in the EPR cavity that are normally dedicated to sample access, to variable temperature inserts as well as for other inserts usually needed for EPR spectroscopy.

The invention claimed is:

1. A microwave resonator for an electron paramagnetic resonance ("EPR") probehead comprising:
   a cavity body supporting an electromagnetic microwave resonance mode, and comprising at least one sample opening for inserting a sample in a sample container, at least one microwave opening for transmitting microwave radiation into the resonator, and at least one access opening;
   a modifier vessel fixed in the at least one access opening for containing a modifier fluid comprising at least one of an attenuator fluid that varies a Q-factor of the resonator, a marker fluid for calibrating an EPR signal of the resonator and an adaptor fluid that varies a dielectric loading of the resonator, the modifier vessel being configured for filling and discharging the modifier fluid gradually into or out of the cavity body; and
   a modifier reservoir outside the cavity body that is connected to the modifier vessel via a first pump.

2. A resonator according to claim 1, wherein the cavity body has two access openings for accommodating an inlet and an outlet of the modifier vessel.

3. A resonator according to claim 2, wherein the two access openings are located symmetrically with respect to a microwave B-field symmetry plane in the cavity body.

4. A resonator according to claim 1, wherein a part of the modifier vessel extending inside the cavity body is spatially fixed to a support fixed to the cavity body.

5. A resonator according to claim 1, wherein the cavity body is a cylindrical TE011 mode cavity and the modifier vessel inside the cavity body is arranged to a minimum extent of 50% of its length along a cylindrical surface centered around an axis of the cylindrical TE011 mode cavity.

6. A resonator according to claim 1 wherein the cavity body is a rectangular TE102 mode cavity or a cylindrical TM110 mode cavity and the modifier vessel traverses the walls of the cavity body and runs partially outside the cavity body.

7. A resonator according to claim 1 wherein the modifier vessel inside the cavity body is arranged to a minimum extent of 50% of its length along isolines of constant electric field E for Q-variation and D-variation or along isolines of constant magnetic field B for M-variation.

8. A resonator according to claim 1 wherein the modifier vessel inside the cavity body is arranged to a minimum extent of 80% of its length along isolines of constant electric field E for Q-variation and D-variation or along isolines of constant magnetic field B for M-variation.

9. A resonator according to claim 1, wherein the modifier vessel is branched to the modifier reservoir via a first valve and to a neutral fluid reservoir via a second valve and a second pump, thereby allowing replacement of the modifier fluid in the cavity body with the neutral fluid, the neutral fluid having no dominant effect on Q-variation and/or M-variation and/or D-variation.

10. A resonator according to claim 1, wherein the resonator comprises at least two modifier vessels, each modifier vessel containing a different type of modifier fluid.

11. A resonator according to claim 10, wherein each modifier vessel is connected to a separate modifier reservoir via a pump allowing for independently filling and discharging each modifier fluid into or out of the cavity body.

12. A resonator according to claim 1, wherein the modifier fluid contains at least two different types of modifier materials.

13. A resonator according to claim 1, wherein the modifier vessel in the cavity body is arranged to a minimum extent of 50% of its length at the maximum of the electric field energy of the microwave mode for Q-variation, at the minimum of the z-component of the magnetic field strength of the microwave mode for D-variation, in a region where the z-component of the magnetic field strength of the microwave mode is not zero for M-variation, whereas the z-axis is defined by the center of the sample opening and the center of the cavity.

14. A resonator according to claim 1 wherein the modifier vessel comprises a dielectric capillary.

15. An EPR spectrometer with a probehead comprising a microwave resonator according to claim 1.

* * * * *